(12) United States Patent
Xu

(10) Patent No.: US 11,876,091 B2
(45) Date of Patent: Jan. 16, 2024

(54) ELECTROSTATIC DISCHARGE PROTECTION WIRING, MANUFACTURING METHOD THEREOF, AND DISPLAY PANEL

(71) Applicant: Wuhan China Star Optoelectronics Technology Co., Ltd., Hubei (CN)

(72) Inventor: Li Xu, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 592 days.

(21) Appl. No.: 17/254,910

(22) PCT Filed: Jun. 17, 2020

(86) PCT No.: PCT/CN2020/096555
§ 371 (c)(1),
(2) Date: Dec. 22, 2020

(87) PCT Pub. No.: WO2021/243751
PCT Pub. Date: Dec. 9, 2021

(65) Prior Publication Data
US 2022/0189948 A1    Jun. 16, 2022

(30) Foreign Application Priority Data
Jun. 5, 2020 (CN) .......................... 202010504019.5

(51) Int. Cl.
*H01L 27/02* (2006.01)
*G02F 1/1362* (2006.01)

(52) U.S. Cl.
CPC .... *H01L 27/0292* (2013.01); *G02F 1/136204* (2013.01)

(58) Field of Classification Search
CPC ............ H01L 27/0292; H01L 27/0288; G02F 1/136204; G02F 1/136227; G02F 1/136286; G02F 2202/22
USPC .......................................................... 257/355
See application file for complete search history.

(56) References Cited

U.S. PATENT DOCUMENTS

| | | | |
|---|---|---|---|
| 6,310,667 | B1 | 10/2001 | Nakayoshi |
| 2008/0117345 | A1 | 5/2008 | Ishii et al. |
| 2017/0102594 | A1 | 4/2017 | Hu et al. |

FOREIGN PATENT DOCUMENTS

| | | | |
|---|---|---|---|
| CN | 1728207 | | 2/2006 |
| CN | 1928681 | | 3/2007 |
| CN | 101221330 | | 7/2008 |
| CN | 103021945 | | 4/2013 |
| CN | 105182645 | | 12/2015 |
| CN | 107505789 | | 12/2017 |
| CN | 107863340 | | 3/2018 |
| CN | 210575951 | | 5/2020 |
| JP | 07-225393 | | 8/1995 |
| JP | 2001255557 | A * | 9/2001 |

(Continued)

*Primary Examiner* — Tan N Tran

(57) ABSTRACT

An electrostatic discharge protection wiring is provided, and the electrostatic discharge protection wiring includes a gate signal line, a driving circuit, a gate connection line, and a source/drain. By disposing the bent gate connection line at an end of the gate signal line, the electrostatic discharge passes through the bent gate connection line to lose a part of current, thus reducing an effect of the electrostatic discharge to prevent bright spots at edges of panels caused by the weak electrostatic discharge.

7 Claims, 2 Drawing Sheets

(56) References Cited

FOREIGN PATENT DOCUMENTS

| KR | 2002-0087548 | 11/2002 |
|----|--------------|---------|
| KR | 10-2008-0011855 | 2/2008 |

* cited by examiner

ELECTROSTATIC DISCHARGE PROTECTION WIRING, MANUFACTURING METHOD THEREOF, AND DISPLAY PANEL

RELATED APPLICATIONS

This application is a National Phase of PCT Patent Application No. PCT/CN2020/096555 having International filing date of Jun. 17, 2020, which claims the benefit of priority of Chinese Patent Application No. 202010504019.5 filed on Jun. 5, 2020. The contents of the above applications are all incorporated by reference as if fully set forth herein in their entirety.

FIELD AND BACKGROUND OF THE INVENTION

The present disclosure relates to the field of display technology, and specifically, to an electrostatic discharge protection wiring, a manufacturing method thereof, and a display panel.

Currently, due to mature processes and stable yields of thin film transistor-liquid crystal display (TFT-LCD) products, the TFT-LCD products still are a first choice for many mobile phones, tablets, and vehicle display screens. Current small and medium-sized products mostly are active matrix liquid crystal displays in which gate driver on array (GOA) lines are evenly distributed on both sides of display panels. Limited by the space, gate signal lines are not treated with a special electrostatic discharge (ESD) protection, so the gate signal lines are in a floating state. In manufacturing processes, the ESD risk always exists. Since an active area (AA) including an end of the gate signal line is not treated with the special ESD protection, pixels at edges of the active area are easily damaged by the ESD, thus forming bright spots at edges of the display panel.

SUMMARY OF THE INVENTION

Technical Problem

Embodiments of the present disclosure provides an electrostatic discharge protection wiring, a manufacturing method of the electrostatic discharge protection wiring, and a display panel which reduce bright spots at edges caused by weak electrostatic discharge.

Technical Solutions

The present disclosure provides an electrostatic discharge protection wiring including:
  a gate signal line including a first end and a second end;
  a driving circuit connected with the first end;
  a gate connection line connected with the second end, wherein at least one part of the gate connection line is bent; and
  a source/drain electrode connected with an end of the gate connection line away from the second end, and partially covering the end of the gate connection line away from the second end.

In some embodiments, an interlayer insulation layer is disposed between the gate connection line and the source/drain electrode, the interlayer insulation layer is provided with at least one through hole, and the gate connection line is connected with the source/drain electrode through the at least one through hole.

In some embodiments, a shape of the at least one through hole is cylindrical, square column-shaped, or truncated cone-shaped.

In some embodiments, a width of the gate connection line is less than a width of the gate signal line.

In some embodiments, a size of a space occupied by the gate connection line being bent is equal to a size of a space occupied by a main pixel.

In some embodiments, the gate connection line is completely bent.

In some embodiments, the gate connection line is bent to be zigzag-shaped, serpentine-shaped, pulse-shaped, rugged polyline-shaped, wave-shaped, or sawtooth-shaped.

The present disclosure provides a manufacturing method of an electrostatic discharge protection wiring including steps of:
  providing a gate signal line including a first end and a second end;
  connecting a driving circuit to the first end;
  connecting a gate connection line to the second end, wherein at least one part of the gate connection line is bent; and
  connecting a source/drain electrode to an end of the gate connection line away from the second end.

In some embodiments, the step of connecting the source/drain electrode to the end of the gate connection line away from the second end includes steps of:
  disposing an interlayer insulation layer at the end of the gate connection line away from the second end, wherein the interlayer insulation layer partially covers the end of the gate connection line away from the second end;
  forming at least one through hole on the interlayer insulation layer; and
  disposing the source/drain electrode on the at least one through hole and the interlayer insulation layer, wherein the gate connection line is connected with the source/drain electrode through the at least one through hole.

The embodiments of the present disclosure provide a display panel including at least two above-mentioned electrostatic discharge protection wirings, and the electrostatic discharge protection wiring includes:
  a gate signal line including a first end and a second end;
  a driving circuit connected with the first end;
  a gate connection line connected with the second end, wherein at least one part of the gate connection line is bent; and
  a source/drain electrode connected with an end of the gate connection line away from the second end, and partially covering the end of the gate connection line away from the second end.

In some embodiments, an interlayer insulation layer is disposed between the gate connection line and the source/drain electrode In some embodiments, the interlayer insulation layer is provided with at least one through hole, and the gate connection line is connected with the source/drain electrode through the at least one through hole.

In some embodiments, a shape of the at least one through hole is cylindrical, square column-shaped, or truncated cone-shaped.

In some embodiments, a width of the gate connection line is less than a width of the gate signal line.

In some embodiments, a size of a space occupied by the gate connection line being bent is equal to a size of a space occupied by a main pixel.

In some embodiments, the gate connection line is completely bent.

In some embodiments, the gate connection line is bent to be zigzag-shaped, serpentine-shaped, pulse-shaped, rugged polyline-shaped, wave-shaped, or sawtooth-shaped.

In some embodiments, the electrostatic discharge protection wirings are formed by means of a manufacturing method of the electrostatic discharge protection wiring, and the manufacturing method of the electrostatic discharge protection wiring includes steps of:

providing the gate signal line including the first end and the second end;

connecting the driving circuit to the first end;

connecting the gate connection line to the second end, wherein at least one part of the gate connection line is bent; and connecting the source/drain electrode to the end of the gate connection line away from the second end.

In some embodiments, the step of connecting the source/drain electrode to the end of the gate connection line away from the second end includes steps of:

disposing an interlayer insulation layer at the end of the gate connection line away from the second end, wherein the interlayer insulation layer partially covers the end of the gate connection line away from the second end;

forming at least one through hole on the interlayer insulation layer; and disposing the source/drain electrode on the at least one through hole and the interlayer insulation layer, wherein the gate connection line is connected with the source/drain electrode through the at least one through hole.

Advantageous Effects

The electrostatic discharge protection wiring provided by the embodiments of the present disclosure includes the gate signal line, the driving circuit, the gate connection line, and the source/drain electrode. The gate signal line includes the first end and the second end, the driving circuit is connected with the first end, the gate connection line is connected with the second end, and at least one part of the gate connection line is bent. The gate/source electrode is connected with the end of the gate connection line away from the second end, and partially covers the end of the gate connection line away from the second end. By disposing the bent gate connection line at an end of the gate signal line, the electrostatic discharge passes through the bent gate connection line to lose a part of current, thus reducing an effect of the electrostatic discharge to prevent the bright spots at the edges of a panel caused by the weak electrostatic discharge.

BRIEF DESCRIPTION OF THE SEVERAL VIEWS OF THE DRAWINGS

In order to clearly illustrate technical solutions in embodiments of the present disclosure, the drawings required for using in the description of the embodiments is briefly described below. Obviously, the drawings in the following description are only some of the embodiments of the present disclosure. For those skilled in the art, other drawings may also be obtained in accordance with these drawings without making for creative efforts.

DESCRIPTION OF SPECIFIC EMBODIMENTS OF THE INVENTION

In combination with accompanying drawings in embodiments of the present disclosure below, technical solutions in the embodiments of the present disclosure are clearly and completely described. Obviously, the described embodiments are merely a part of the embodiments of the present disclosure, rather than all the embodiments. Based on the embodiments in the present disclosure, all of other embodiments obtained by those skilled in the art without making for creative efforts belong to the scope protected by the present disclosure.

In the description of the present disclosure, it should be illustrated and understood that indicative directions or position relations, such as terms "upper", "lower", "front", "back", "inner", and "outer", are based on directions or position relations indicated by the accompanying drawings. The indicative directions or position relations are only for convenience of describing the present disclosure and simplifying the description, and do not indicate or imply that indicated devices or elements must have a specific orientation and be constructed and operated in a specific orientation. Therefore, the indicative directions or position relations cannot be understood to be limitation to the present disclosure.

The embodiments of the present disclosure provide an electrostatic discharge protection wiring, a manufacturing method of the electrostatic discharge protection wiring, and a display panel. The electrostatic discharge protection wiring is introduced in detail below.

Figure 1:
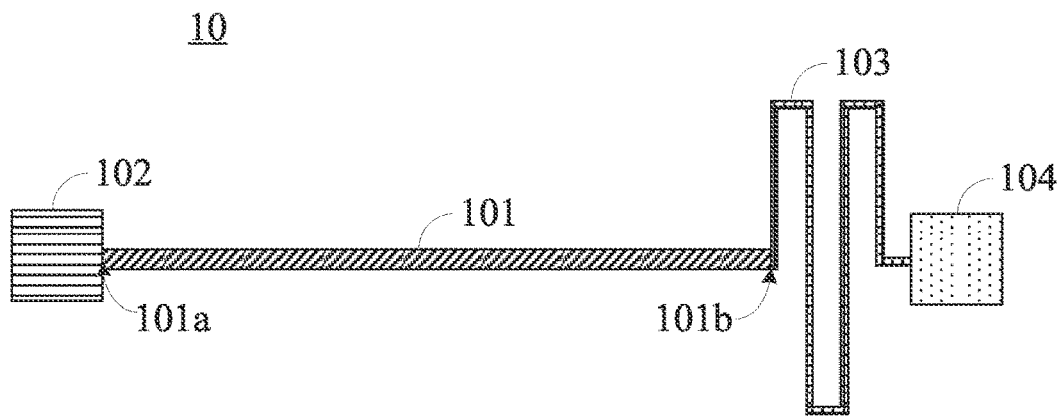
FIG. 1 is a structural schematic view of an electrostatic discharge protection wiring provided by embodiments of the present disclosure.

Referring to the FIG. 1, FIG. 1 is a structural schematic view of an electrostatic discharge protection wiring 10 provided by the embodiments of the present disclosure. The electrostatic discharge protection wiring 10 includes a gate signal line 101, a driving circuit 102, a gate connection line 103, and a source/drain electrode 104. The gate signal line 101 includes a first end 101a and a second end 101b, the driving circuit 102 is connected with the first end 101a, the gate connection line 103 is connected with the second end 101b, and at least one part of the gate connection line 103 is bent. The source/drain electrode 104 is connected with an end of the gate connection line 103 away from the second end 101b, and partially covers the end of the gate connection line 103 away from the second end. By disposing the bent gate connection line 103 at an end of the gate signal line 101, the electrostatic discharge passes through the bent gate connection line 103 to lose a part of current, thus reducing an effect of the electrostatic discharge to prevent bright spots at edges of a panel caused by the weak electrostatic discharge.

The driving circuit 102 is an electric circuit in which gate driver integrated circuits are arranged on an array substrate (gate driver on array, GOA) to replace an external driver chip. The application of the GOA may reduce manufacturing processes, decrease production costs of products, and improve integration of the display panel, thus thinning the display.

Figure 2:
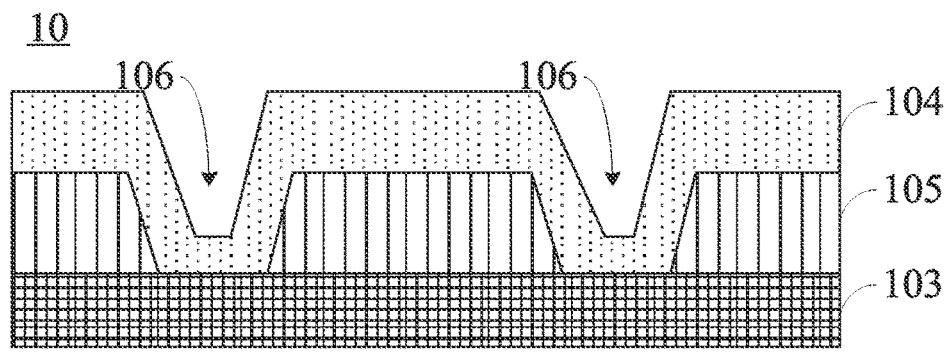
FIG. 2 is a partial sectional view of a connection between a gate connection line and a source/drain electrode provided by embodiments of the present disclosure.

Referring to FIG. 2, FIG. 2 is a partial sectional view of a connection between a gate connection line and a source/drain electrode provided by embodiments of the present disclosure. An interlayer insulation layer 105 is disposed between the gate connection line 103 and the source/drain electrode 104, the interlayer insulation layer 105 is provided with at least one through hole 106, and the gate connection line 103 is connected with the source/drain electrode 104 through the at least one through hole 106. The at least one through hole 106 is formed on the interlayer insulation layer 105 for the electrostatic discharge protection. If the electrostatic discharge still exists after passing through the gate connection line 103, the at least one through hole 106 is damaged, but pixels located in an active area are not affected.

In FIG. 2, the at least one through hole 106 in a shape of truncated cone is taken as an example, but this example does not limit the shape of the at least one through hole 106. The shape of the at least one through hole 106 is cylindrical, square column-shaped, or truncated cone-shaped. The at least one through hole 106 configured to be cylindrical may allow stresses on the at least one through hole to be evenly distributed, thus preventing deformation or cracks of the at least through hole caused by uneven stress and ensuring the connection of the gate connection line 103 and the source/drain electrode 104. The at least one through hole 106 configured to be square column-shaped may allow the source/drain electrode 104 to be closely fitted in the at least one through hole 106 and not to be easily peeled off. Configuring the at least one through hole 106 to be truncated cone-shaped facilitates disposing the source/drain electrode 104 and enables the source/drain electrode to be flatly disposed, so that poor performance cause by excessive bending is less likely to occur. Therefore, while the gate connection line 103 is ensured to contact the source/drain electrode 104, the source/drain electrode may also obtain desirable work performance.

A width of the gate connection line 103 is less than a width of the gate signal line 101. The gate connection line 103 is disposed to reduce defects caused by the electrostatic discharge. The longer a length of the gate connection line 103 is, the better the reduction effect on the electrostatic discharge is. Since the width of the gate connection line 103 is less than the width of the gate signal line 101, the length of the gate connection line 103 may be configured to be longer, thus performing the electrostatic discharge well.

A size of a space occupied by the gate connection line being bent is equal to a size of a space occupied by a main pixel. Based on different sizes of the main pixels of various products, the gate connection line 103 may be bent with different designs, so that the gate connection line 103 may adapt to the product well, thus creating the desirable effect of the electrostatic discharge protection on the different products.

The gate connection line 103 is completely bent. Specifically, the gate connection line 103 is bent in a multi-fold manner. Since the gate connection line 103 is completely bent, the length of the gate connection line 103 may be configured to be longer, and the gate connection line 103 through which the electrostatic discharge passes is long, thus effectively reducing the effect of the electrostatic discharge on the circuit.

The gate connection line 103 is bent to be zigzag-shaped, serpentine-shaped, pulse-shaped, rugged polyline-shaped, wave-shaped, or sawtooth-shaped. These bending forms enable the long gate connection line 103 to be bent in a small space, so that a pathway through which the electrostatic discharge passes is long, and thus the reduction effect on the electrostatic discharge is effective.

The electrostatic discharge protection wiring 10 provided by the embodiments of the present disclosure includes the gate signal line 101, the driving circuit 102, the gate connection line 103, and the source/drain electrode 104. By disposing the gate connection line 103, which is at least partially bent, at an end of the gate signal line 101, when the electrostatic discharge (ESD) passes through the bent gate connection line, a part of current may be lost, thus reducing the effect of the electrostatic discharge. Additionally, the interlayer insulation layer 105 is disposed between the end of the gate connection line 103 away from the gate signal line 101 and the source/drain electrode 103, and the interlayer insulation layer 105 is provided with the at least one through hole 106. If the ESD still exists after passing through the gate connection line 103, the at least one through hole 106 is damaged, but the pixels located in the active area are not affected, thus preventing the bright spots at the edges of the panel caused by the weak ESD.

Figure 3:
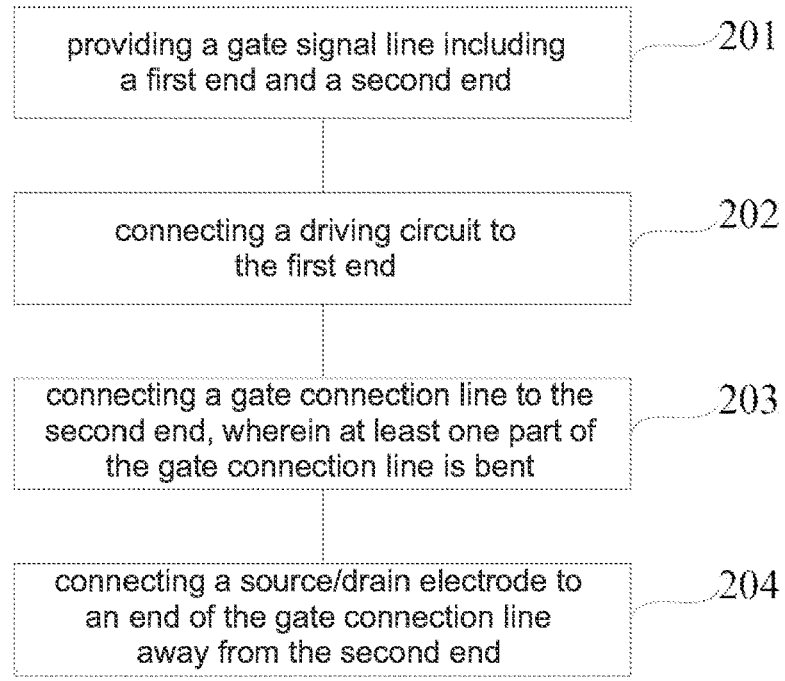
FIG. 3 is a schematic flow chart of a manufacturing method of the electrostatic discharge protection wiring provided by embodiments of the present disclosure.

The embodiments of the present disclosure provide a manufacturing method of the electrostatic discharge wiring, the manufacturing method of the electrostatic discharge wiring is introduced in detail below. Referring to FIG. 3, FIG. 3 is a schematic flow chart of the manufacturing method of the electrostatic discharge protection wiring provided by the embodiments of the present disclosure.

A step of 201 is providing a gate signal line including a first end and a second end.

A step of 202 is connecting a driving circuit to the first end.

A step of 203 is connecting a gate connection line to the second end, wherein at least one part of the gate connection line is bent.

A step of 204 is connecting a source/drain electrode to an end of the gate connection line away from the second end.

Specifically, an interlayer insulation layer is disposed at the end of the gate connection line away from the second end, and the interlayer insulation layer partially covers the end of the gate connection line away from the second end. The interlayer insulation layer is provided with at least one through hole. The source/drain electrode is disposed on the at least one through hole and the interlayer insulation layer. The gate connection line is connected with the source/drain electrode through the at least one through hole. The at least one through hole is formed for the electrostatic discharge protection. If the electrostatic discharge still exists after passing through the gate connection line, the at least one through hole is damaged, but pixels located in an active area are not affected.

The manufacturing method of the electrostatic discharge protection wiring provided by the embodiments of the present disclosure is used to manufacture an electrostatic discharge protection wiring including the gate signal line, the driving circuit, the gate connection line, and the source/drain electrode. By disposing the gate connection line, which is at least partially bent, at an end of the gate signal line, when the ESD passes through the bent gate connection line, a part of current is lost, thus reducing the effect of the electrostatic discharge. Additionally, the interlayer insulation layer is disposed between the end of the gate connection line away from the gate signal line and the source/drain electrode, and the interlayer insulation layer is provided with the at least one through hole. If the ESD still exists after passing through the gate connection line, the at least one through hole is damaged, but the pixels located in the active area are not affected, thus preventing the bright spots at the edges of the panel caused by the weak ESD.

Figure 4:
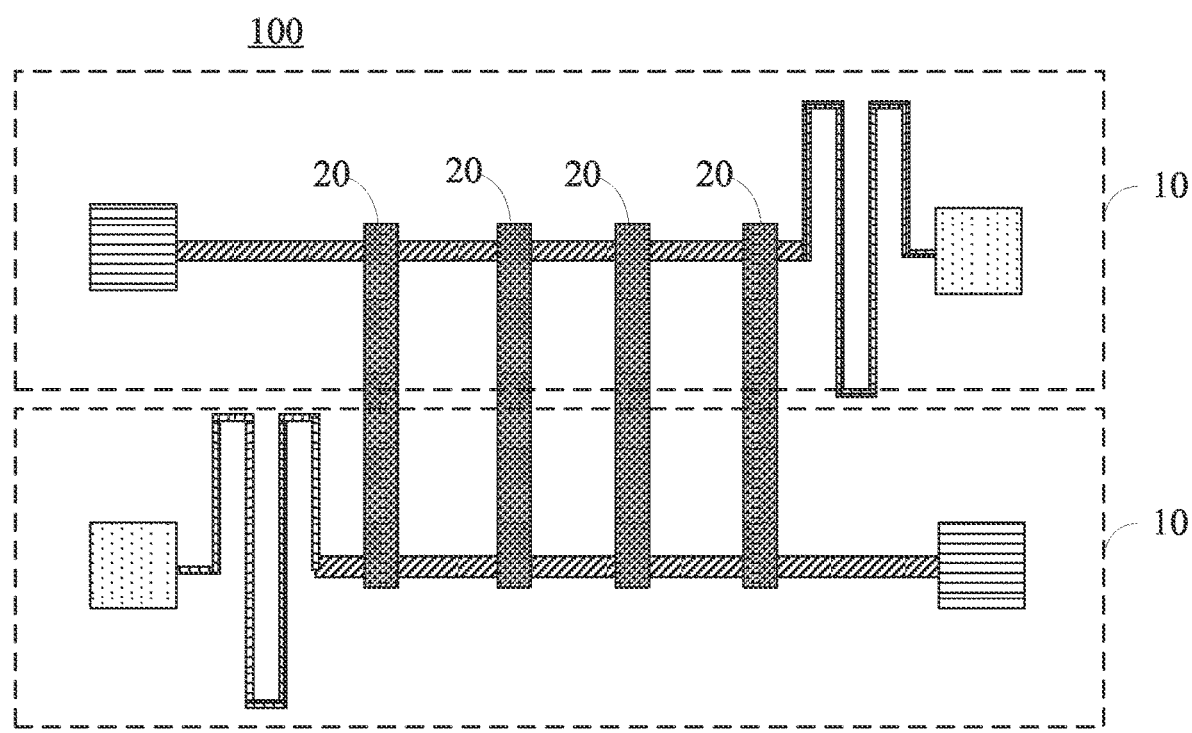
FIG. 4 is a structural schematic view of a display panel provided by embodiments of the present disclosure.

A display panel 100 provided by the embodiments of the present disclosure. FIG. 4 is a structural schematic view of a display panel provided by embodiments of the present disclosure. The display panel 100 includes at least two electrostatic discharge wirings 10 and a plurality of signal lines 20, and the electrostatic discharge wirings are connected with each other through the signal lines 20. The display panel 100 may also include other devices. In the embodiments of the present disclosure, the source/drain signal lines 20, other devices, and assemblies thereof are related techniques well known to those skilled in the art, and are not redundantly described in detail herein.

The display panel 100 provided by the embodiments of the present disclosure includes at least two electrostatic discharge wirings 10 and the signal lines 20. The electrostatic discharge wiring 10 includes a gate signal line 101, a driving circuit 102, a gate connection line 103, and a source/drain electrode 104. By disposing the gate connection line 103, which is at least partially bent, at an end of the gate signal line 101, when the ESD passes through the bent gate connection line, a part of current is lost, thus reducing the effect of the electrostatic discharge. Additionally, an interlayer insulation layer 105 is disposed between an end of the gate connection line 103 away from the gate signal line 101 and the source/drain electrode 103, and the interlayer insulation layer 105 is provided with the at least one through hole 106. If the ESD still exists after passing through the gate connection line 103, the at least one through hole 106 is damaged, but pixels located in an active area are not affected, thus preventing the bright spots at the edges of the panel caused by the weak ESD.

The electrostatic discharge protection wiring, the manufacturing method of the electrostatic discharge protection wiring, and the display panel provided the embodiments of the present disclosure are introduced in detail above. Specific examples herein are used to explain the principles and the implementation of the present disclosure. The illustration of the foregoing embodiments is only used to facilitate understanding the present disclosure. Moreover, for those skilled in the art, both of the specific embodiments and the application scope can still be modified in accordance with the idea of the present disclosure. In summary, the content of the specification should not be understood the limitation to the present disclosure.

What is claimed is:

1. An electrostatic discharge protection wiring, comprising:
   a gate signal line including a first end and a second end;
   a driving circuit connected with the first end;
   a gate connection line connected with the second end, wherein at least one part of the gate connection line is bent; and
   a source/drain electrode connected with an end of the gate connection line away from the second end, and partially covering the end of the gate connection line away from the second end; wherein an interlayer insulation layer is disposed between the gate connection line and the source/drain electrode, the interlayer insulation layer is provided with at least one through hole, and the gate connection line is connected with the source/drain electrode through the at least one through hole; wherein a width of the gate connection line is less than a width of the gate signal line; wherein a size of a space occupied by the gate connection line being bent is equal to a size of a space occupied by a main pixel; and wherein the gate connection line is completely bent.

2. The electrostatic discharge protection wiring according to claim 1, wherein a shape of the at least one through hole is cylindrical, square column-shaped, or truncated cone-shaped.

3. The electrostatic discharge protection wiring according to claim 1, wherein the gate connection line is bent to be zigzag-shaped, serpentine-shaped, pulse-shaped, rugged polyline-shaped, wave-shaped, or sawtooth-shaped.

4. A manufacturing method of an electrostatic discharge protection wiring, comprising steps of:
   providing a gate signal line including a first end and a second end;
   connecting a driving circuit to the first end;
   connecting a gate connection line to the second end, wherein at least one part of the gate connection line is bent; and
   connecting a source/drain electrode to an end of the gate connection line away from the second end; wherein the step of connecting the source/drain electrode to the end of the gate connection line away from the second end includes steps of: disposing an interlayer insulation layer at the end of the gate connection line away from the second end, wherein the interlayer insulation layer partially covers the end of the gate connection line away from the second end; forming at least one through hole on the interlayer insulation layer; and disposing the source/drain electrode on the at least one through hole and the interlayer insulation layer, wherein the gate connection line is connected with the source/drain electrode through the at least one through hole; wherein a width of the gate connection line is less than a width of the gate signal line; wherein a size of a space occupied by the gate connection line being bent is equal to a size of a space occupied by a main pixel; and wherein the gate connection line is completely bent.

5. A display panel comprising at least two electrostatic discharge protection wirings, wherein the electrostatic discharge protection wiring includes:
   a gate signal line including a first end and a second end;
   a driving circuit connected with the first end;
   a gate connection line connected with the second end, wherein at least one part of the gate connection line is bent; and
   a source/drain electrode connected with an end of the gate connection line away from the second end, and partially covering the end of the gate connection line away from the second end; wherein an interlayer insulation layer is disposed between the gate connection line and the source/drain electrode, the interlayer insulation layer is provided with at least one through hole, and the gate connection line is connected with the source/drain electrode through the at least one through hole; wherein a width of the gate connection line is less than a width of the gate signal line; wherein a size of a space occupied by the gate connection line being bent is equal to a size of a space occupied by a main pixel; and wherein the gate connection line is completely bent.

6. The display panel according to claim 5, wherein a shape of the at least one through hole is cylindrical, square column-shaped, or truncated cone-shaped.

7. The display panel according to claim 5, wherein the gate connection line is bent to be zigzag-shaped, serpentine-shaped, pulse-shaped, rugged polyline-shaped, wave-shaped, or sawtooth-shaped.

* * * * *